(12) United States Patent
Balakrishnan et al.

(10) Patent No.: US 7,772,706 B2
(45) Date of Patent: Aug. 10, 2010

(54) AIR-GAP ILD WITH UNLANDED VIAS

(75) Inventors: Sridhar Balakrishnan, Portland, OR (US); Boyan Boyanov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/965,665

(22) Filed: Dec. 27, 2007

(65) Prior Publication Data

US 2009/0166881 A1 Jul. 2, 2009

(51) Int. Cl.
*H01L 21/4763* (2006.01)

(52) U.S. Cl. .................. 257/774; 438/619; 438/622; 438/623; 438/624; 257/410; 257/775; 257/759; 257/E21.573; 257/E21.581

(58) Field of Classification Search ......... 438/618–619, 438/622–624, 627, 637, 639, 699–700, 970; 257/410, 759, 775, E21.573, E21.581, 774
See application file for complete search history.

(56) References Cited

U.S. PATENT DOCUMENTS

| | | | | |
|---|---|---|---|---|
| 5,214,283 A | * | 5/1993 | Le | 250/307 |
| 5,880,018 A | * | 3/1999 | Boeck et al. | 438/619 |
| 6,035,530 A | * | 3/2000 | Hong | 29/885 |
| 6,207,556 B1 | * | 3/2001 | Hsu | 438/637 |
| 7,392,746 B2 | | 7/2008 | Hansen | |
| 2001/0016412 A1 | * | 8/2001 | Lee et al. | 438/622 |
| 2003/0224591 A1 | * | 12/2003 | Latchford et al. | 438/619 |
| 2004/0063305 A1 | * | 4/2004 | Kloster et al. | 438/619 |
| 2004/0214427 A1 | * | 10/2004 | Kloster et al. | 438/637 |
| 2007/0269956 A1 | | 11/2007 | Lavoie et al. | |

FOREIGN PATENT DOCUMENTS

| KR | 20030002523 A | 1/2003 |
|---|---|---|
| KR | 20030049563 A | 6/2003 |

OTHER PUBLICATIONS

International Search Report and Written Opinion for PCT application No. PCT/US2008/084680, mailed on Mar. 24, 2009, 14 Pages.

* cited by examiner

*Primary Examiner*—A. Sefer
*Assistant Examiner*—Ermias Woldegeorgis
(74) *Attorney, Agent, or Firm*—Michael D. Plimier

(57) ABSTRACT

A spacer is adjacent to a conductive line. Vias that do not completely land on the conductive line land on the spacer and do not punch through into a volume below the spacer.

17 Claims, 9 Drawing Sheets

US 7,772,706 B2

AIR-GAP ILD WITH UNLANDED VIAS

BACKGROUND

Background of the Invention

Low dielectric constant materials are used as interlayer dielectrics in microelectronic structures, such as semiconductor structures, to reduce the RC delay and improve device performance. The eventual limit for a dielectric constant is k=1, which is the value for a vacuum. Methods and structures have been proposed to incorporate void spaces or "air gaps" in attempts to obtain dielectric constants closer to k=1.

DETAILED DESCRIPTION

Various embodiments of semiconductor dies with air gap ILD and unlanded vias are discussed in the following description. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative example representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order, in series or in parallel, than the described embodiment. Various additional operations may be performed and/or described operations may be omitted in additional embodiments.

Figure 1:
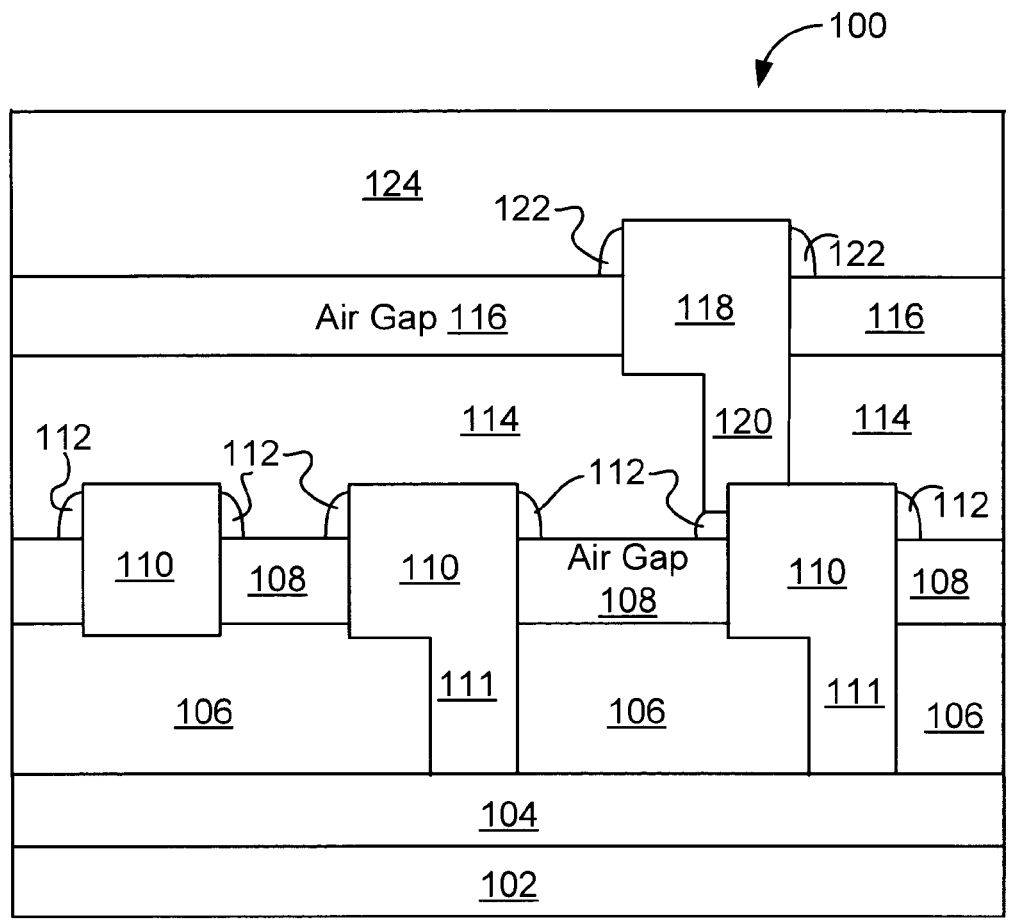
FIG. 1 is a cross sectional side view that illustrates a device having an air gap ILD and an unlanded via.

FIG. 1 is a cross sectional side view that illustrates a semiconductor die 100 having an air gap ILD 108, 116 and an unlanded via 120. In the illustrated example, there is a substrate 102. This substrate 102 may comprise any material that may serve as a foundation upon which a semiconductor device may be built. In one example, substrate 102 is a silicon containing substrate, although other materials may be used in other examples. The substrate 102 may be a bulk substrate, such as a wafer of single crystal silicon, a silicon-on-insulator (SOI) substrate, such as a layer of silicon on a layer of insulating material on another layer of silicon, or another type of substrate. In the example, there is a device layer 104 formed on the substrate 102. The device layer 104, contains a number of transistors that make up a microprocessor in one example. In other examples, the device layer 104 may include other devices that and have different purposes. In embodiments that include transistors in the device layer 104, the device 104 may include a planar transistor, a multi-gate transistor, or another type of transistor or other device.

There is a first interlayer dielectric (ILD) layer 106 on the device layer 104. In one example, the dielectric layer 106 comprises a carbon doped oxide (CDO) material with a low dielectric constant (a "low k" material) of between about 2.7 and about 3.0. Any other suitable material may be used, such as an organic material, a different inorganic material, materials with different k values, and mechanical reliability.

There is a second ILD layer 114 over the first ILD layer 106, and a first air gap 108 that separates the first and second ILD layers 106, 114. In one example of the die 100, the first and second ILD layers 106, 114 consist essentially of the same material. In other examples, it is possible to use different dielectric materials in the first and second ILD layers 106, 114.

The air gap 108 that separates the first and second ILD layers 106, 114 can be considered another ILD layer, an air gap ILD layer 108. As the k value of an air gap approaches that of a vacuum, the air gap ILD layer 108 helps lower the effective k value of the dielectric stack.

There are conductive lines 110 that extend across the air gap ILD layer 108 from the first ILD layer 106 to the second ILD layer 114 in the illustrated example. These conductive lines may comprise a metal or other electrically conductive material to conduct electrical signals to and from the devices of the device layer 104. In other examples, instead of electrically conductive lines 110, there may be optical waveguides through which optical signals travel to and from devices of the device layer 104. In yet other examples, there may simply be pillars or other structures that do not provide signal pathways. The illustrated example die 100 also includes conductive vias 111. These vias 111 extend from the conductive lines 110 to make contact with the device layer 104. Like the lines 110, the vias 111 may comprise a metal or other electrically conductive material to conduct electrical signals to and from the devices of the device layer 104. In other examples, instead of electrically conductive vias 111, there may be optical waveguides through which optical signals travel to and from devices of the device layer 104.

Adjacent to the lines 110 are etch stop spacers 112. The spacers 112 comprise a material that etches at a different rate than the material of the ILD layer 114 around them. Any suitable material may be used for the etch stop spacers 112. The spacers 112 extend out from the conductive lines 110, but do not cover the entire area between the conductive lines 110 in this example. The spacers 112 may be considered to have an inner boundary adjacent the side wall of the conductive line 110 and an outer boundary away from the conductive line 110.

There is a third ILD layer 124 over the second ILD layer 114, and a second air gap 116 that separates the second and third ILD layers 114, 124. In one example of the die 100, the second and third ILD layers 114, 124 consist essentially of the same material. In other examples, it is possible to use different dielectric materials in the second and third ILD layers 114, 124. Like the first air gap ILD layer 108, the air gap 116 that separates the second and third ILD layers 114, 124 can be considered another ILD layer, an air gap ILD layer 116. As the k value of an air gap approaches that of a vacuum, the second air gap ILD layer 116 helps lower the effective k value of the dielectric stack.

There are conductive lines 118 that extend across the second air gap ILD layer 116 from the second ILD layer 114 to the third ILD layer 124 in the illustrated example. These conductive lines 118 are similar to the conductive lines 110 discussed above, and may comprise various conductive materials or may comprise non-conductive materials, as discussed above with respect to conductive lines 110. There are etch stop spacers 122 adjacent to these conductive lines 118 as well, in the illustrated embodiment. These etch stop spacers 122 are similar to the etch stop spacers 112 discussed above.

As illustrated, vias 120 may extend from conductive line 118 to contact lower conductive line 110. In some cases, these vias 120 may be unlanded vias as they extend out beyond the boundary of the conductive line 110. As the spacers 112 extend out from the conductive line 110, the unlanded via 120 may fail to extend past the outer boundary of the spacer 112. Thus, the unlanded via 120 is on a combination of the spacer 112 and the conductive line 10 in this example case. The spacers 112 may prevent unlanded vias 120 from extending into the air gap 108 space, thus allowing the use of air gaps 108, 116 and their low k-values even in situations where there may be unlanded vias 120.

FIGS. 2 through 14 are cross sectional side views that illustrate how a die 100 like that illustrated in FIG. 1 may be made according to one embodiment of the present invention.

Figure 2:
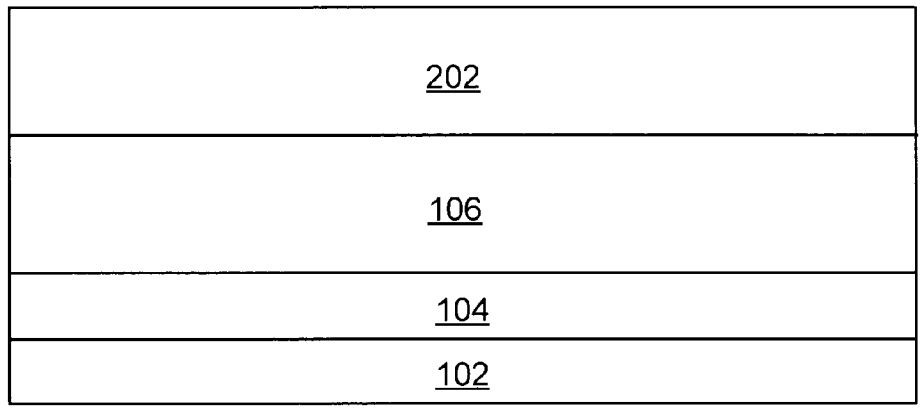
FIG. 2 is a cross sectional side view that shows the substrate, the device layer, the first ILD layer and a first sacrificial layer.

FIG. 2 is a cross sectional side view that shows the substrate 102, the device layer 104, the first ILD layer 106 and a first sacrificial layer 202. The substrate 102, the device layer 104, and the first ILD layer 106 have been described above. The first sacrificial layer 202 comprises a material that can be at least partially removed later to leave behind the first air gap ILD layer 108. Among the materials that may be used for the first sacrificial layer 202 are a porous carbon doped oxide, a different porous material, thermally decomposable materials, and chemically decomposable materials. Any suitable material that may be partially or completely selectively removed may be used.

Figure 3:
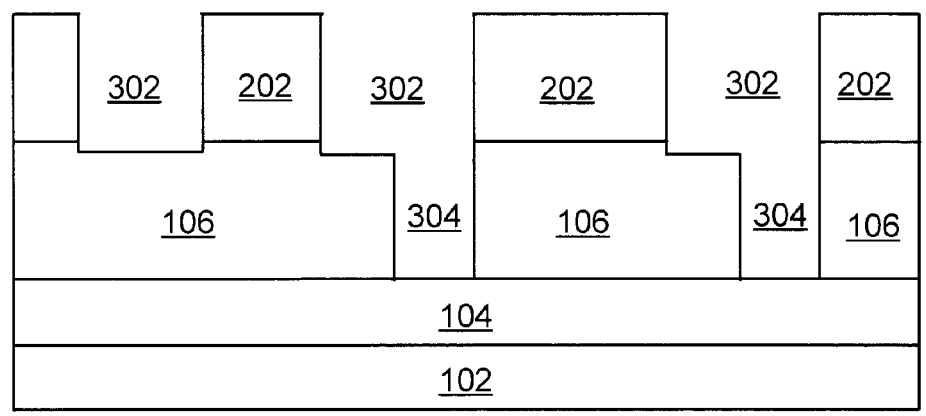
FIG. 3 is a cross sectional side view that shows the first ILD layer and first sacrificial layer after they have been patterned.

FIG. 3 is a cross sectional side view that shows the first ILD layer 106 and first sacrificial layer 202 after they have been patterned. The patterning creates trenches 302 and via holes 304 in which the lines 110 and vias 111 can be deposited. Any suitable method may be used to pattern the first ILD layer 106 and first sacrificial layer 202.

Figure 4:
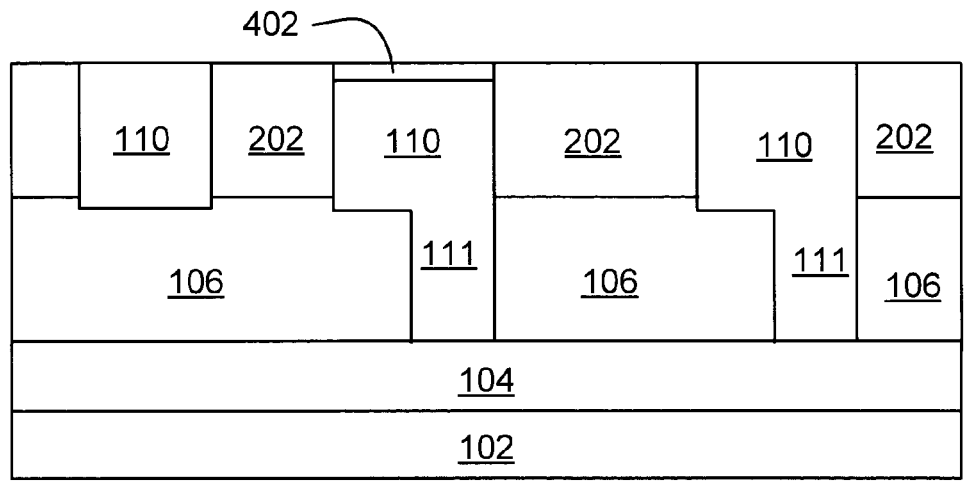
FIG. 4 is a cross sectional side view that shows the lines and vias deposited in the trenches and via holes.

FIG. 4 is a cross sectional side view that shows the lines 110 and vias 111 deposited in the trenches 302 and via holes 304. Any suitable method may be used to create the lines 110 and vias 111. For example, a barrier layer may be deposited in the trenches 302 and via holes 304, then a seed layer deposited on the barrier layer, followed by electroplating of a metal such as copper or another conductor to make the bulk of the lines 110 and vias 111, and the top surface of the lines 110 may then be planarized by a process such as chemical mechanical polishing. Other method and materials may also be used. In some embodiments, the top of the lines 110 may have a capping layer 402, such as cobalt capping layer 402 on a largely copper line 110, as shown in the middle line 110 of the example illustrated in FIG. 4. Other embodiments may lack such a cap 402 or have a cap 402 of materials other than cobalt.

Figure 5:
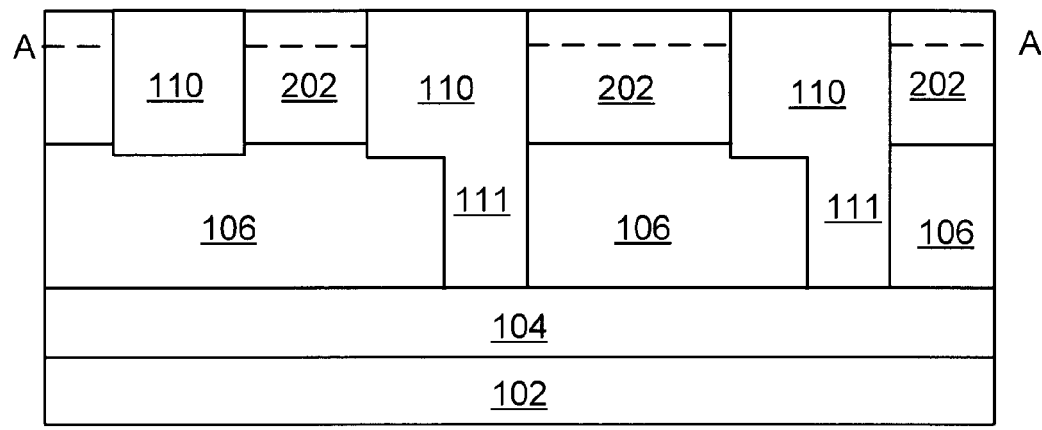
FIG. 5 is a cross sectional side view that shows the sacrificial layer after a damage layer has been formed to a selected depth in the sacrificial layer.

FIG. 5 is a cross sectional side view that shows the sacrificial layer 202 after a damage layer has been formed to a selected depth in the sacrificial layer 202. Dashed line A-A denotes the depth of the damage layer in the sacrificial layer 202. The damage layer may be formed by exposing the sacrificial layer 202 to a plasma in one embodiment. The voltage, time of exposure, power, pressure, and plasma species are chosen to result in the desired depth of damage. Other methods may also be used to create a damage layer.

Figure 6:
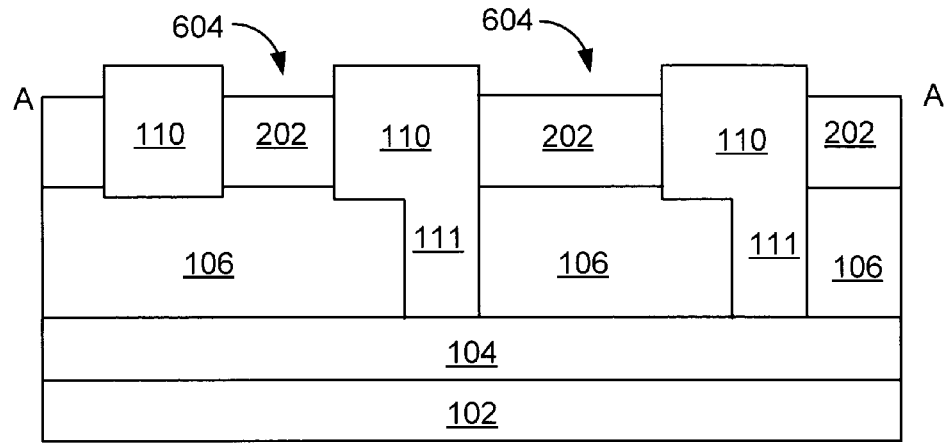
FIG. 6 is a cross sectional side view that illustrates the removed damage layer.

FIG. 6 is a cross sectional side view that illustrates the removed damage layer. In some embodiments, the damage to the sacrificial layer 202 increases the damaged portion's susceptibility to a given wet etch solution. After the damage layer is created, it is wet etched to removed the damage layer without removing a significant portion of the remaining sacrificial layer 202. The removal of the damaged portions of the sacrificial layer 202 results in recesses 604 where the damaged sacrificial layer 202 formerly existed. Other methods than creating a damaged layer and removing that damaged layer may be used to create the recesses 604. For example, a timed dry etch may be used.

Figure 7:
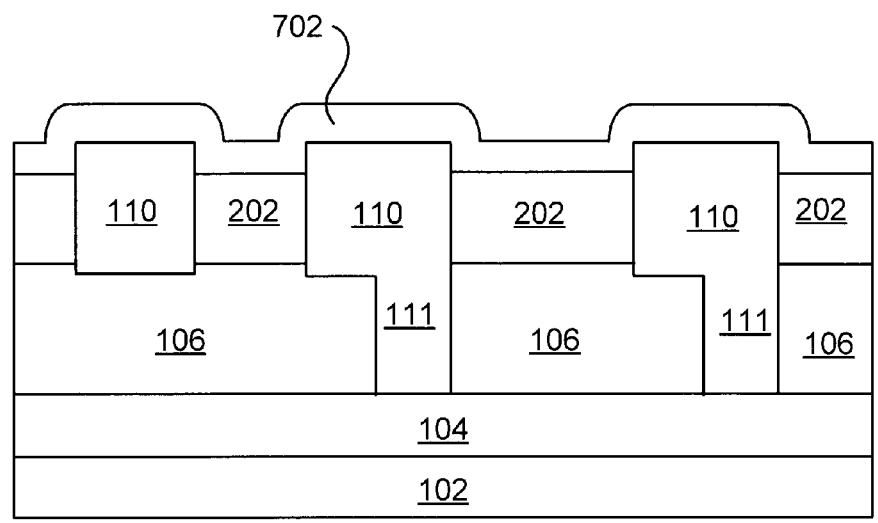
FIG. 7 is a cross sectional side view that illustrates a spacer layer formed on the lines and in the recesses.

FIG. 7 is a cross sectional side view that illustrates a spacer layer 702 formed on the lines 110 and in the recesses 604. In the illustrated embodiment, the spacer layer 702 is formed conformally. In embodiments where the lines 110 comprise copper and lack an electromigration barrier or cap, the spacer layer 702 material may be chosen to avoid copper oxidation. In such cases, a material such as a carbon doped nitride may be chosen. In other embodiments that include a capping layer 402, other materials with that may have a lower k value than the carbon doped nitride may be used. Any suitable material that etches at a different rate than the material of the sacrificial layer 202 may be used for the spacer layer 702. In some embodiments, the spacer layer 702 may comprise multiple layers of different materials, rather than just one layer of a single material.

Figure 8:
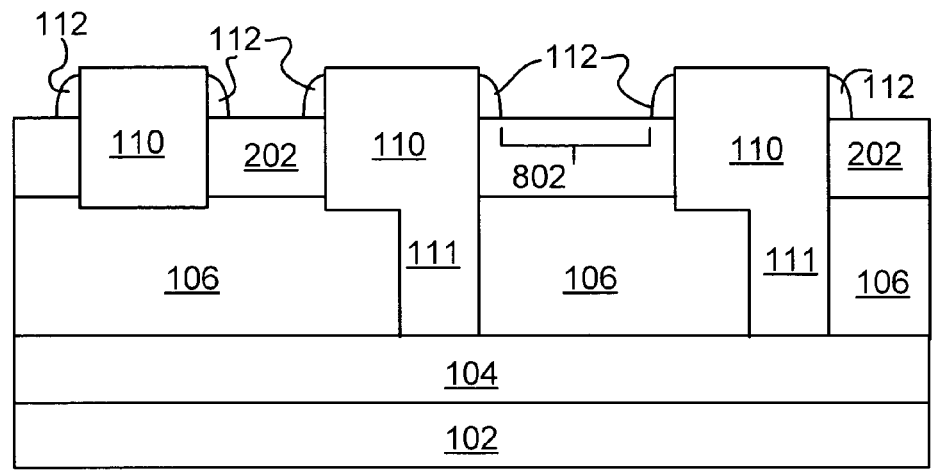
FIG. 8 is a cross sectional side view that illustrates spacers created by etching the spacer layer.

FIG. 8 is a cross sectional side view that illustrates spacers 112 created by etching the spacer layer 702. An etchant selective to the spacer layer 702 material relative to the sacrificial layer 202 material is used to remove the spacer layer 702 from the top surface of the lines 110 and portions of the top surface of the sacrificial layer 202 to form the spacers 112 adjacent to the lines 110. This etching of the spacer layer 702 material results in gaps 802 where the sacrificial layer 202 is exposed. The thickness of the spacer layer 702 and the etching conditions may be selected to result in a desired width of the gap 802.

Figure 9:
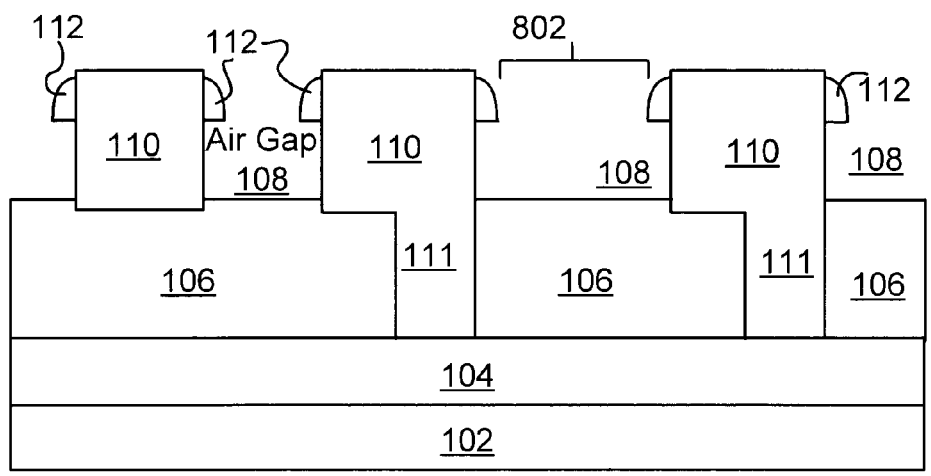
FIG. 9 is a cross sectional side view that illustrates the die after the sacrificial layer has been removed, leaving behind an air gap.

FIG. 9 is a cross sectional side view that illustrates the die 100 after the sacrificial layer 202 has been removed, leaving behind an air gap 108. Depending on the material of the sacrificial layer 202, it may be removed by any suitable method, such as thermally or chemically. The portions of the sacrificial layer 202 that are removed can escape through the gap 802. While FIG. 9 shows the sacrificial layer 202 as substantially completely removed, with only traces of the sacrificial layer 202 remaining, this may not be the case in all embodiments. Some embodiments may leave portions of the sacrificial layer 202 behind. For example, if the sacrificial layer 202 comprises a porous material with a porogen, the porogen may be removed, leaving the porous material behind. In yet other embodiments, the die 100 may lack a sacrificial layer 202 and thus not remove any of the material immediately below the spacer 112. In such embodiments, the first ILD layer 106 may extend all the way from adjacent the device layer 104 to adjacent the spacers 112. Alternatively, there may be a layer of a non-sacrificial material that remains in place, rather than the sacrificial layer 202 that is at least partially removed.

Figure 10:
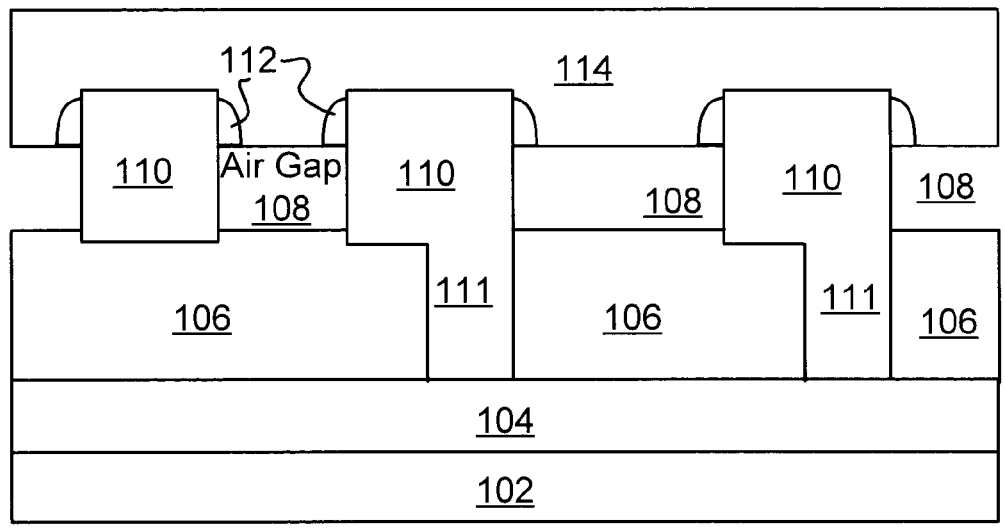
FIGS. 10 and 10a are cross sectional side views that illustrate the second ILD layer deposited on the lines and spacers.

FIG. 10 is a cross sectional side view that illustrates the second ILD layer 114 deposited on the lines 110 and spacers 112. The second ILD layer 114 is illustrated as extending down to the bottom of the spacers 112, but it may not be coplanar with the spacer 112 bottoms in some other embodiments. The second ILD layer 114 in FIG. 10 and most other figures is shown in an idealized form, such as having a planar bottom boundary. In embodiments the second ILD layer 114 and other ILD layers over air gaps 108 may actually appear differently and have a different shape.

Figure 10A:
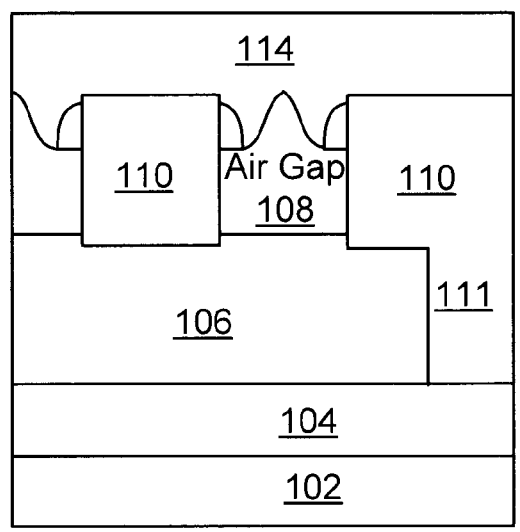

FIG. 10a is a cross sectional side view that illustrates the second ILD layer 114 deposited on the lines 110 and spacers 112, shown in a less-idealized way than in FIG. 10. As shown in FIG. 10a, the second ILD layer 114 has a concave-shaped bottom boundary over the gap between spacers 112. Such formations may result, for example, if the second ILD layer 114 is deposited with a plasma CVD process (note that any suitable method may be used to make the second ILD layer 114). Other variations of the second ILD layer 114 may have some of the ILD material deposited on the sidewalls of the conductive lines 110 and/or on the top of the first ILD layer 106, at the bottom of the air gap 108.

Figure 11:
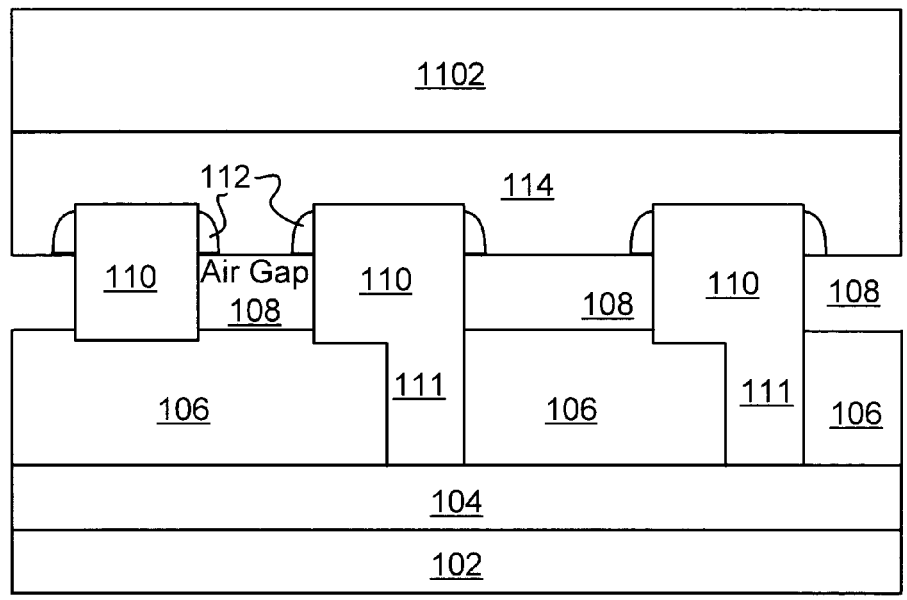
FIG. 11 is a cross sectional side view that illustrates a second sacrificial layer deposited on the second ILD layer.

FIG. 11 is a cross sectional side view that illustrates a second sacrificial layer 1102 deposited on the second ILD layer 114. The second sacrificial layer 1102 may comprise the same material as the first sacrificial layer 202, or a different suitable material that may be partially or completely selectively removed.

Figure 12:
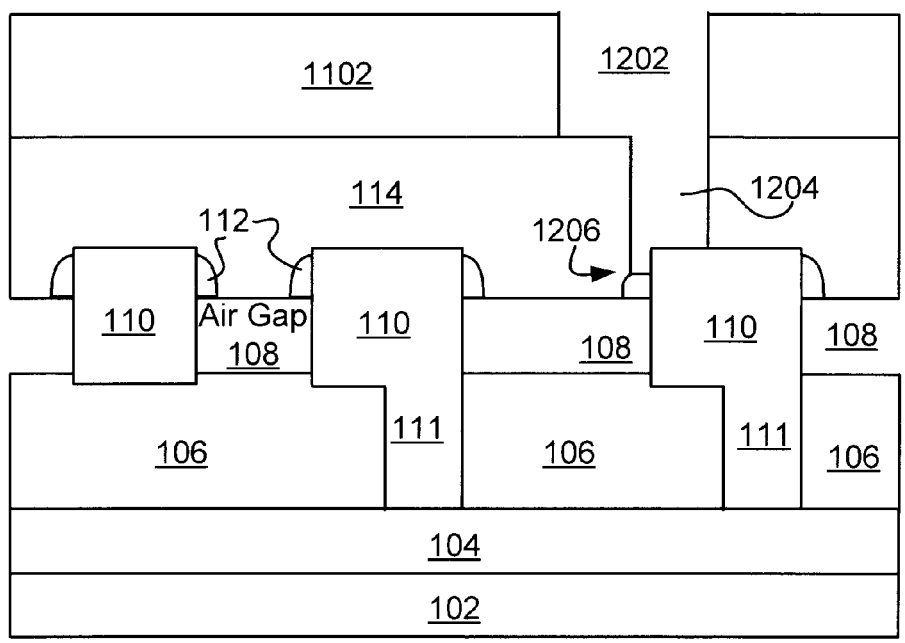
FIG. 12 is a cross sectional side view that shows the second ILD layer and second sacrificial layer after they have been patterned.

FIG. 12 is a cross sectional side view that shows the second ILD layer 114 and second sacrificial layer 1102 after they have been patterned. The patterning creates trenches 1202 and via holes 1204 in which the lines 118 and vias 120 can be deposited. Any suitable method may be used to pattern the second ILD layer 114 and second sacrificial layer 1102. As illustrated in FIG. 12, the patterning for the trenches 1202 and via holes 1204 may not be perfectly aligned with the lower level of lines 110. Via hole 1204 extends past the boundary of the line 110. Thus, via hole 1204 is an unlanded via hole 1204. However, spacer 1206 extends beyond the line 110 and prevents the via hole 1204 from punching through to the air gap 108 beneath. Spacer 1206 may act as an etch stop spacer and be etched by the process used to make via hole 1204 at a slower rate than second ILD layer 114, thus improving the chances that via hole 1204 will not punch through to the air gap 108.

After the trench 1202 and via hole 1204 are formed, they are filled to form the line 118 and via 120 illustrated in FIG. 1. This may be done in a similar matter to the formation of lines 110 and vias 111, described above. As the spacer 1206 prevented unlanded via hole 1204 from punching through to air gap 108, unlanded via 120 may be formed properly. If the via hole 1204 had punched through to air gap 108, via 120 may have failed to form, or may have extended into air gap 108, which could result in shorts, a higher k value, or other problems. Thus, the use of spacers 112 allow for unlanded vias 120 in dies 100 with air gaps 108 with fewer problems than if the spacers had been omitted.

Further layers of air gaps, lines and vias may be formed similar to the layers described above. For example, the sacrificial layer 1102 may be removed similarly to how sacrificial layer 202 was removed, to form a second air gap ILD 116.

Figure 13:
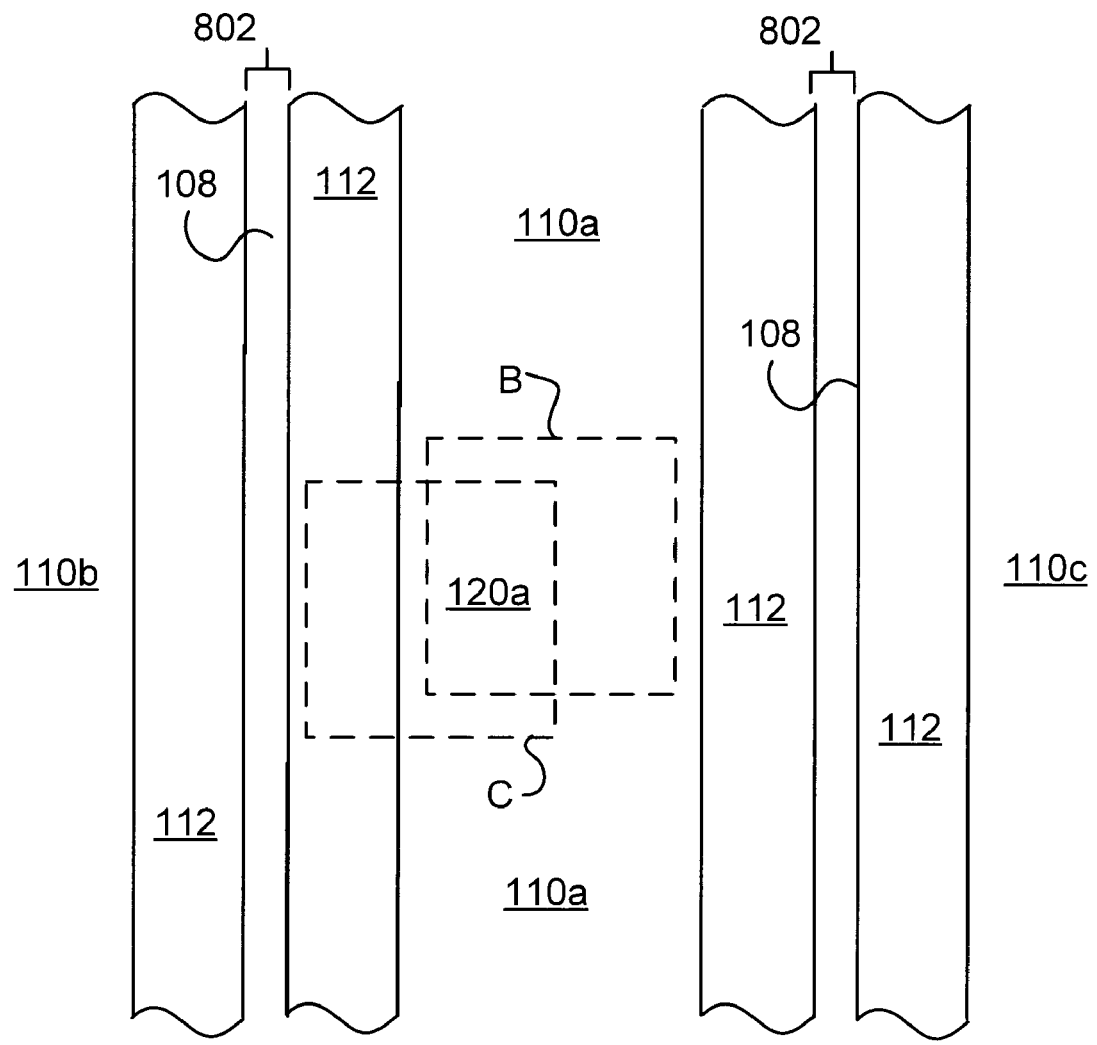
FIG. 13 is a top view that illustrates a layout scheme that may optionally be used in the die.

FIG. 13 is a top view that illustrates a layout scheme that may optionally be used in the die 100. FIG. 13 shows three lines, 110a in the middle, 110b on the left, and 110c on the right. The middle line 110a will have a via 120a that extends down from another higher level of lines 118 and vias 120 above. Dashed box B indicates where the via 120a should hit the line 110a. Dashed box C indicates where the via 120a actually did hit line 110a. Due to alignment imperfections, the dashed box C indicates that via 120a is an unlanded via because it extends beyond line 110a. However, the spacer 112 provides an extra margin for error. The via 120a does not extend past the outer boundary of the spacer 112 and thus does not extend into the air gap 108 below, where it may cause problems.

Figure 14:
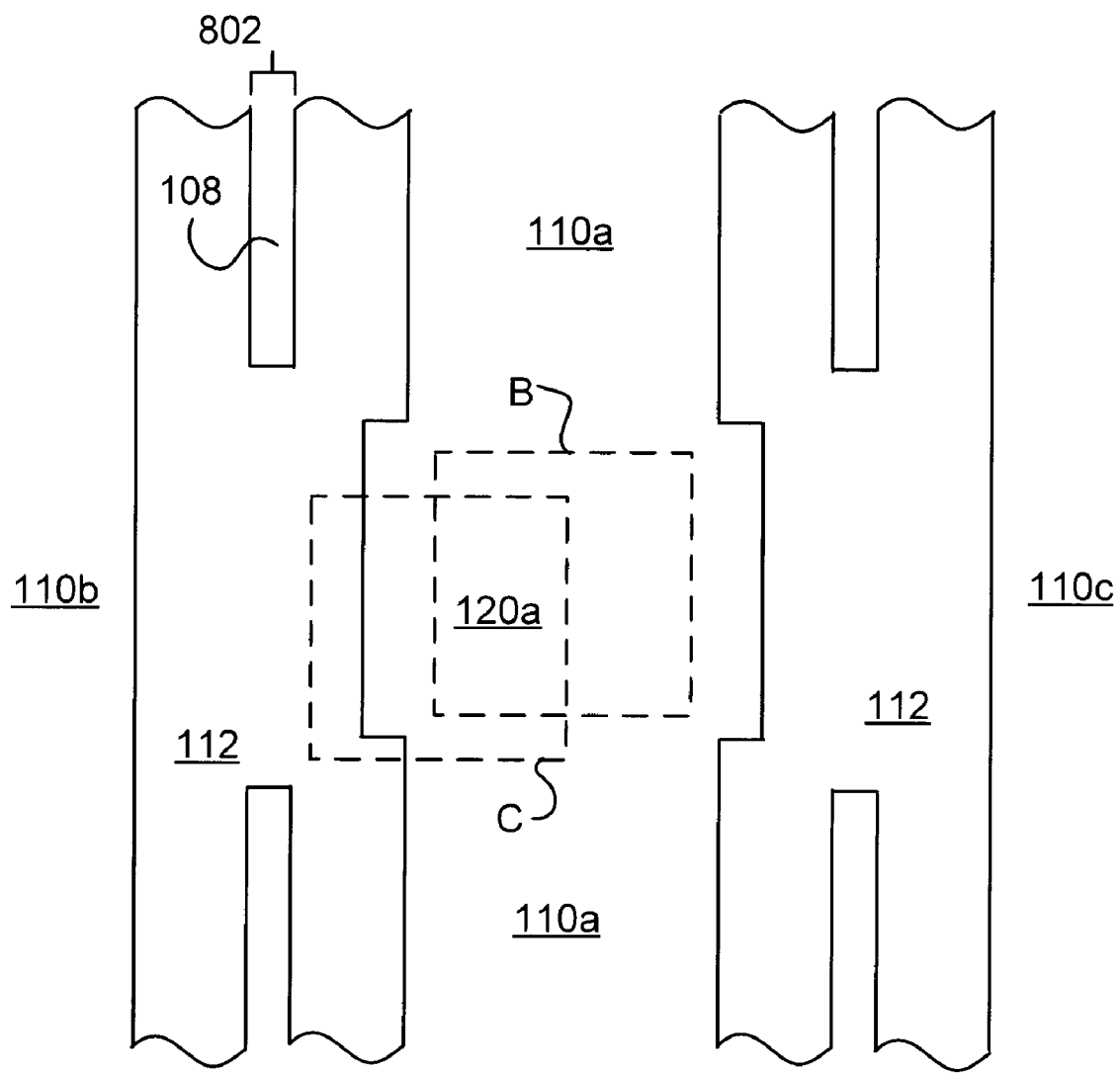
FIG. 14 is a top view that illustrates another layout scheme that may optionally be used in the die.

FIG. 14 is a top view that illustrates another layout scheme that may optionally be used in the die 100. FIG. 14 shows three lines, 110a in the middle, 110b on the left, and 110c on the right. The middle line 110a will have a via 120a that extends down from another higher level of lines 118 and vias 120 above. The line 110a close to the via 120a is wider than elsewhere. Because of this, there is no gap 802 between line 110a and line 110b or 110c close to the via 120a. The sacrificial layer 202 is not exposed in that portion. Rather, the spacer 112 extends all the way from line 110a to line 110b. Further from the via 120a, line 110a is narrower and the spacer 112 does not extend all the way from line 110a to line 110b, leaving gap 802 where the sacrificial layer 202 is exposed.

The dashed box B indicates the planned landing area for via 120a. However, due to process variances, the via 120a may be an unlanded via 120a and extend beyond the boundary of line 110a, as indicated by dashed box C. Such a via 120a that extends past the boundary of line 110a is considered an unlanded via. Because the via 120a would still end on spacer 112 even if it extended past the line 110a, this layout helps prevent unlanded vias 120a from extending into the air gap 108 below, where it may cause problems. Because there is no gap 802 between lines 110a and 110b to the left and right of the planned via 120a landing area, the allowable margin of error in this embodiment is increased compared to the embodiment illustrated in FIG. 13.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method to make interconnects for a semiconductor die, comprising:
    forming a spacer adjacent a first conductive line, the spacer extending a distance from the first conductive line;
    forming a top dielectric layer on the spacer and first conductive line;
    forming an unlanded via hole that extends through the top dielectric layer to the first conductive line and the spacer, the spacer acting as an etch stop to prevent the via hole from extending below the spacer; and
    wherein the first conductive line has a first width within a selected distance of a desired area for the via hole to land and a second width less than the first width beyond the first distance; and
    wherein a second conductive line is spaced apart from the first conductive line, the spacer extends from the first conductive line to the second conductive line at locations where the first conductive line has the first width, and the spacer extends from the first conductive line but does not extend all the way to the second conductive line at locations where the first conductive line has the second width.

2. The method of claim 1, wherein forming the spacer comprises:
    forming a sacrificial layer on a bottom dielectric layer;
    forming the first conductive line;
    forming recesses in the sacrificial layer adjacent the first conductive line by removing portions of the sacrificial layer;
    forming a spacer layer on the recessed sacrificial layer and first conductive line;
    removing portions of the spacer layer from a top of the first conductive line and portions of a top surface of the recessed sacrificial layer, resulting in the spacers being on the sacrificial layer and adjacent the first conductive line; and
    removing at least a portion of the sacrificial layer.

3. The method of claim 1, wherein the first width is defined by a first line that extends laterally from a first side of the first conductive line to a second side of the first conductive line and beneath the via hole, and the first conductive line does not extend beyond the first width along the first line used to define the first width; the second width is defined by a second line that extends laterally from the first side of the first conductive line to the second side of the first conductive line and not beneath the via hole, and the first conductive line does not extend beyond the second width along the second line used to define the second width; and the first line is substantially the same distance from a substrate as the second line.

4. The method of claim 3, wherein the first line and the second line are substantially parallel to a substrate on which the first conductive line exists.

5. The method of claim 1, wherein the first conductive line has a long axis substantially parallel to a substrate, the first conductive line has the first width at a first position along the long axis and the first conductive line has the second width at a second position at a second position along the long axis, the second position being spaced apart from the first position.

6. The method of claim 1, wherein:
    the spacer is above an air gap; and
    forming an air gap comprises:
        forming a sacrificial layer on a bottom dielectric layer;
        forming the first conductive line;
        forming the spacer, wherein the spacer has an inner boundary adjacent the first conductive line and an outer boundary away from the first conductive line, at least a portion of the sacrificial layer beyond the outer boundary being exposed; and
    removing at least a portion of the sacrificial layer to leave behind the air gap.

7. A method to make interconnects of a semiconductor die, comprising:
    forming a first dielectric layer comprising a sacrificial material;
    patterning the first dielectric layer to form trenches;
    forming conductive lines in the trenches;
    recessing the first dielectric layer between the trenches;
    forming a layer of spacer material on the first dielectric layer in the recess and on the conductive lines;
    removing portions of the spacer layer from tops of the conductive lines and portions of tops of the first dielectric layer to expose the portions of the first dielectric layer, resulting in spacers adjacent to the conductive lines and on the first dielectric layer;
    removing portions of the first dielectric layer to result in a volume formerly occupied by the first dielectric layer that at least partially comprises air;
    wherein the exposed portions of the first dielectric layer are exposed at gaps between spacers, portions of the first dielectric layer are removed by decomposition, decomposition products being removed through gaps between spacers;
    forming a third dielectric layer on the conductive lines and spacers;
    forming vias through the third dielectric layer, at least one of the vias landing partially on a first one of the conductive lines and partially on a first one of the spacers;
    wherein at least a first conductive line of the conductive lines has a first width adjacent a first via of the formed vias and a second width less than the first width a distance away from the first via; and
    wherein a second conductive line of the conductive lines is spaced laterally apart from the first conductive line, a first spacer of the spacers extends from the first conductive line to the second conductive line at locations between the first via and the portions of the second conductive line closest to the first via, and wherein there are other locations adjacent to where the first conductive line has the second width where the first spacer extends from the first conductive line but does not extend all the way to the second conductive line.

8. The method of claim 7, wherein substantially all of the first dielectric layer is removed.

9. The method of claim 7, wherein the first dielectric layer comprises a porous material and a porogen material, and wherein at least some of the porogen material is removed.

10. The method of claim 7, wherein forming vias through the third dielectric layer comprises:
   etching the third dielectric layer to form a via hole through the third dielectric layer,
      wherein the etchant used to form the via hole etches the third dielectric layer at a faster rate than it etches the spacer so that the spacer acts as an etch stop layer.

11. The method of claim 10, wherein the first dielectric layer comprises a sacrificial material, further comprising removing portions of the first dielectric layer to result in a volume formerly occupied by the first dielectric layer that at least partially comprises air, and wherein the spacer prevents the via hole from punching through to the volume formerly occupied by the first dielectric layer.

12. The method of claim 7, wherein the gaps between spacers are exposed to the environment and are not covered with another dielectric layer while portions of the first dielectric layer are removed.

13. The method of claim 7, wherein the first conductive line has a long axis substantially parallel to a substrate, the first conductive line has the first width at a first position along the long axis and the first conductive line has the second width at a second position at a second position along the long axis, the second position being spaced apart from the first position.

14. A semiconductor die with interconnects, comprising:
   a first conductive line;
   a first spacer adjacent to the first conductive line;
   a first dielectric layer on the first conductive line;
   a first via through the first dielectric layer to the first conductive line, the first via being an unlanded via that extends beyond the first conductive line onto the first spacer;
   wherein the first conductive line has a first width adjacent the via and a second width less than the first width a distance away from the via; and
   wherein a second conductive line is spaced apart from the first conductive line, the spacer extends from the first conductive line to the second conductive line at locations where the first conductive line has the first width, and the spacer extends from the first conductive line but does not extend all the way to the second conductive line at locations where the first conductive line has the second width.

15. The method of claim 14, wherein the first width is defined by a first line that extends laterally from a first side of the conductive line to a second side of the conductive line and beneath the via, and the conductive line does not extend beyond the first width along the first line used to define the first width; the second width is defined by a second line that extends laterally from the first side of the conductive line to the second side of the conductive line and not beneath the via, and the conductive line does not extend beyond the second width along the second line used to define the second width; and the first line is substantially the same distance from a substrate as the second line.

16. The method of claim 14, wherein the conductive line has a long axis substantially parallel to a substrate, the conductive line has the first width at a first position along the long axis and the conductive line has the second width at a second position at a second position along the long axis, the first position being under the via, the second position being spaced apart from the first position.

17. A method to make interconnects for a semiconductor die, comprising:
   forming a spacer adjacent a conductive line, the spacer extending a distance from the conductive line;
   forming a top dielectric layer on the spacer and conductive line;
   forming an unlanded via hole that extends through the top dielectric layer to the conductive line and the spacer, the spacer acting as an etch stop to prevent the via hole from extending below the spacer; and
   wherein the conductive line has a first width within a selected distance of a desired area for the via hole to land and a second width less than the first width beyond the first distance; and
   wherein a second conductive line is spaced laterally apart from the conductive line, the spacer extends from the conductive line to the second conductive line at locations between the unlanded via hole and the portions of the second conductive line closest to the unlanded via hole, and wherein there are other locations adjacent where the conductive line has the second width where the spacer extends from the conductive line but does not extend all the way to the second conductive line.

\* \* \* \* \*